July 13, 1971 R. T. LINDSTROM 3,592,715

STEADY STATE ETCHING SYSTEM

Original Filed Dec. 27, 1966 4 Sheets-Sheet 1

INVENTOR
ROBERT T. LINDSTROM

BY Hansel L. McGee

ATTORNEY

July 13, 1971 R. T. LINDSTROM 3,592,715

STEADY STATE ETCHING SYSTEM

Original Filed Dec. 27, 1966 4 Sheets-Sheet 3

3,592,715
STEADY STATE ETCHING SYSTEM
Robert T. Lindstrom, Orlando, Fla., assignor to International Business Machines Corporation, Armonk, N.Y.
Original application Dec. 27, 1966, Ser. No. 604,940, now Patent No. 3,505,135, dated Apr. 7, 1970. Divided and this application Oct. 8, 1969, Ser. No. 870,899
Int. Cl. C23f 1/02
U.S. Cl. 156—345 5 Claims

ABSTRACT OF THE DISCLOSURE

A steady state system for the etching of printed circuit boards is provided. A metal is removed from an etchant at the rate in which it is dissolved into the etchant and etching reagent consumed during the etching process is replaced at an equivalent rate. Also provided is an improved crystallization tower which is used to continuously remove the dissolved metal. The tower is provided with a series of adjustable baffles to vary the inner diameter of the tower to control crystal size throughout the column. Additionally, there is included a crystal ejection chamber from which precipitated crystals are ejected by a centrifugal force.

CROSS REFERENCE TO RELATED APPLICATIONS

This application is a division of co-pending application Ser. No. 604,940, filed Dec. 27, 1966, now Pat. No. 3,505,135.

BACKGROUND OF THE INVENTION

This invention is directed to a system for steady state etching processes. More particularly, this invention relates to a system wherein copper cladded boards may be continuously etched at a constant rate by an ammonium persulfate etchant and in which the spent etchant is continuously recovered by the removal of copper salts therefrom, which salts are the product of the etching process, said recovered spent etchant being refortified for subsequent reuse. The invention also relates to an improved apparatus for the continuous crystallization of metal salts from a solution.

In the printed circuit art, copper cladded boards are etched according to a desired pattern to obtain electrically conductive circuitry. The desired conductive circuitry is obtained by coating the surface of the boards with an etch resist in the desired pattern, leaving the unwanted metal exposed. The removal of the unwanted metal, normally copper, is accomplished by etching with a solution in which the metal is soluble. The removal of the metal from the board is generally performed in an etching chamber, through which a succession of metal cladded boards are conveyed and sprayed with an etchant to effect the dissolution of the metal.

The etchant, in the case in which copper is the metal to be dissolved, is generally selected from ferric chloride and cuprous chloride solutions. More recently, it has been discovered that ammonium persulfate solutions can be used more advantageously. Where ammonium persulfate solutions are used as the etchant, the etching of copper proceeds according to the following chemical reaction equation:

$$Cu+(NH_4)_2S_2O_8 \rightarrow CuSO_4+(NH_4)_2SO_4$$

The ammonium persulfate etching systems are generally batch systems, i.e., systems in which the etch chamber is charged with a discrete volume of fresh etchant solution. The fresh etchant is recycled from the bottom of the etching chamber (called a sump) and is sprayed continuously on the surfaces of the copper cladded boards. The exposed copper is etched according to the above chemical equation, and the reaction products are dissolved in the etchant. The etch rate is continuously reduced as the etchant concentration diminishes. The reaction is continued to a point where the rate becomes prohibitively slow. At this point, the etchant, containing both reaction products and unused etchant, is dumped into waste treatment facilities and the system is recharged with a fresh batch of etchant.

The presently used batch etching systems can generally utilize only about 50% of the ammonium persulfate etchant. Consequently, about 50% of the unused etchant is disposed of with the spent solution as waste (thus making the process an expensive one). Further steady state etching is, at most, difficult to maintain, because as the etchant is contaminated with the etching by-products, its concentration is reduced causing a decrease in the etching rate. The compensate for changes in etching rates, it is necessary to continually vary the speed of the conveyor carrying the copper cladded boards to insure removal of the exposed copper prior to the boards' emergence from the chamber. This is necessary to avoid overetching and undercutting circuit lines due to overexposure and to provide efficient machine utilization.

In those installations having batch etching systems from which the spent etchant is disposed as waste into streams and rivers, there arises the additional problem of stream pollution. In order to overcome this problem, it is imperative that the copper salts are removed from the spent etchant prior to its discharge into the streams or rivers.

Therefore, an object of this invention is the provision of a continuous etching system which overcomes the problems of the existent systems.

Another object of this invention is the provision of a continuous etching system in which steady state etching may be accomplished without the need for continuously adjusting the conveyor speed.

Yet another object of this invention is the provision of a continuous steady state etching system in which the reaction products are continuously removed and the spent etchant is continuously refortified and reused.

Still another object of this invention is the provision of a continuous steady state etching system in which about 90% or more of the etchant may be advantageously utilized.

Yet another object of this invention is the provision of a continuous steady state etching system in which the etch rate will remain constant.

And yet another object of this invention is the provision of an improved crystallization apparatus to continuously and efficiently remove reaction products as solids in the form of saleable salts.

In addition to the outstanding advantages of obtaining steady state etching, this invention provides additional advantages, such as the more efficient utilization of the etchant, e.g., about 90% or more of the etchant is utilized in the system of this invention. Additionally, the etching reaction by-products are removed as solids in the form of saleable salts, thus eliminating the handling of large quantities of solution. Further, the problem of stream pollution is no longer existent, since the contaminating agents are removed as the above stated saleable salts.

The foregoing and other objects, features and advantages of the invention will be apparent from the following more particular description of preferred embodiments of the invention, as illustrated in the accompanying drawings.

SUMMARY OF THE INVENTION

According to one aspect of this invention, provision has been made for obtaining steady state etching of printed circuit boards. This is accomplished through the combination of an etching system and an etchant recovery system. The ultimate concept in etching is a continuous operation in which a metal is removed from the etchant at a rate in which it is dissolved into the etchant, and the etchant consumed during the etching process is replaced at an equivalent rate. These operations have been performed and the resulting system is characterized by having constant etching characteristics.

Figure 2:
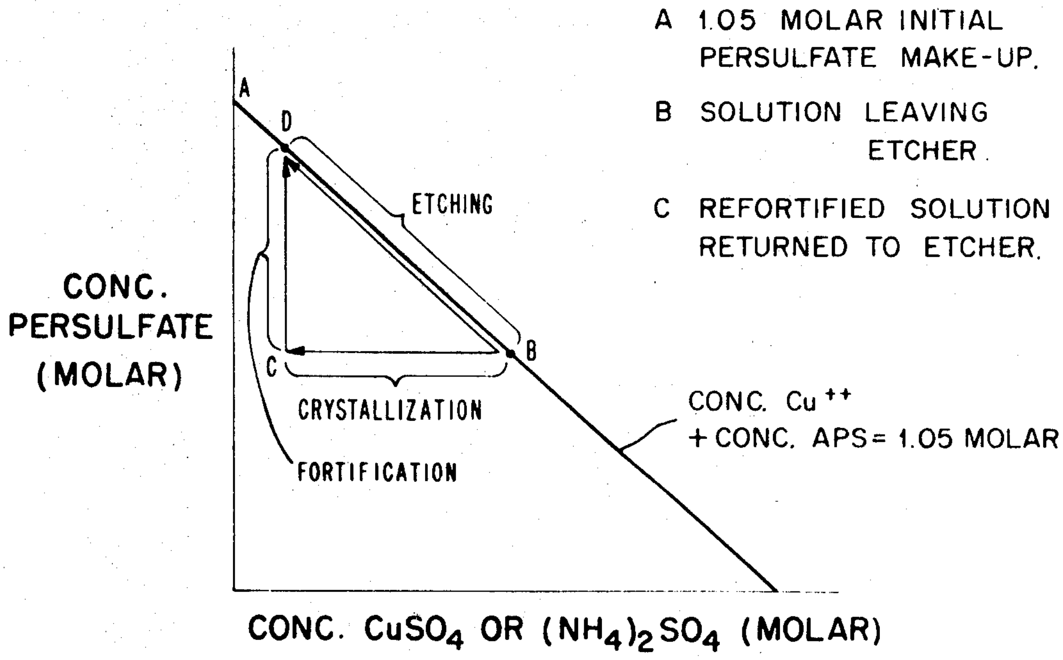
FIG. 2 is a system schematic of the process cycle.
Figure 4:
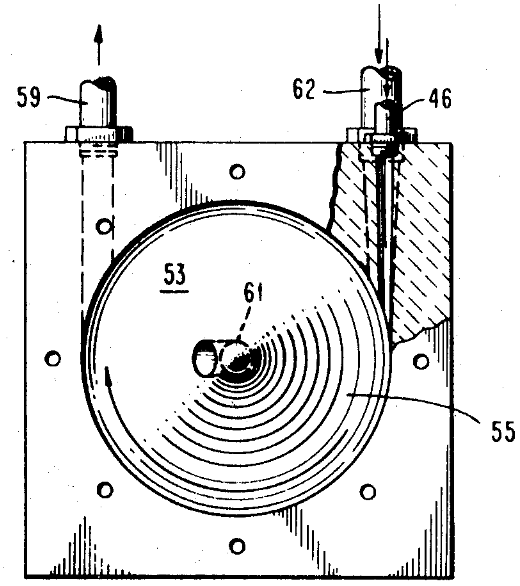
FIG. 4 is a plan view along line 4—4 of FIG. 3, depicting the tangential inflow of the spent etchant into the crystallization tower.

The system concept can be summarized by the schematic presentation shown in FIG. 2, in which an etchant, preferably ammonium persulfate, having an initial predetermined molar concentration (usually 1.05 molar) is flowed across a metal part, e.g., copper, in an etcher depicted as flowing initially from A and then from D to B in the drawing; an increase in copper concentration and a decrease in ammonium persulfate concentration thereby results. The solution is then flowed through a crystallizer B to C, where a portion of the copper is removed from the solution. The solution is then flowed from the crystallizer B through a fortification system C to D, at which time fresh ammonium persulfate is added to the solution to replace that which has been consumed during the etching process. Crystallization and refortification may be performed simultaneously.

DESCRIPTION OF THE PREFERRED EMBODIMENTS

Figure 1A:
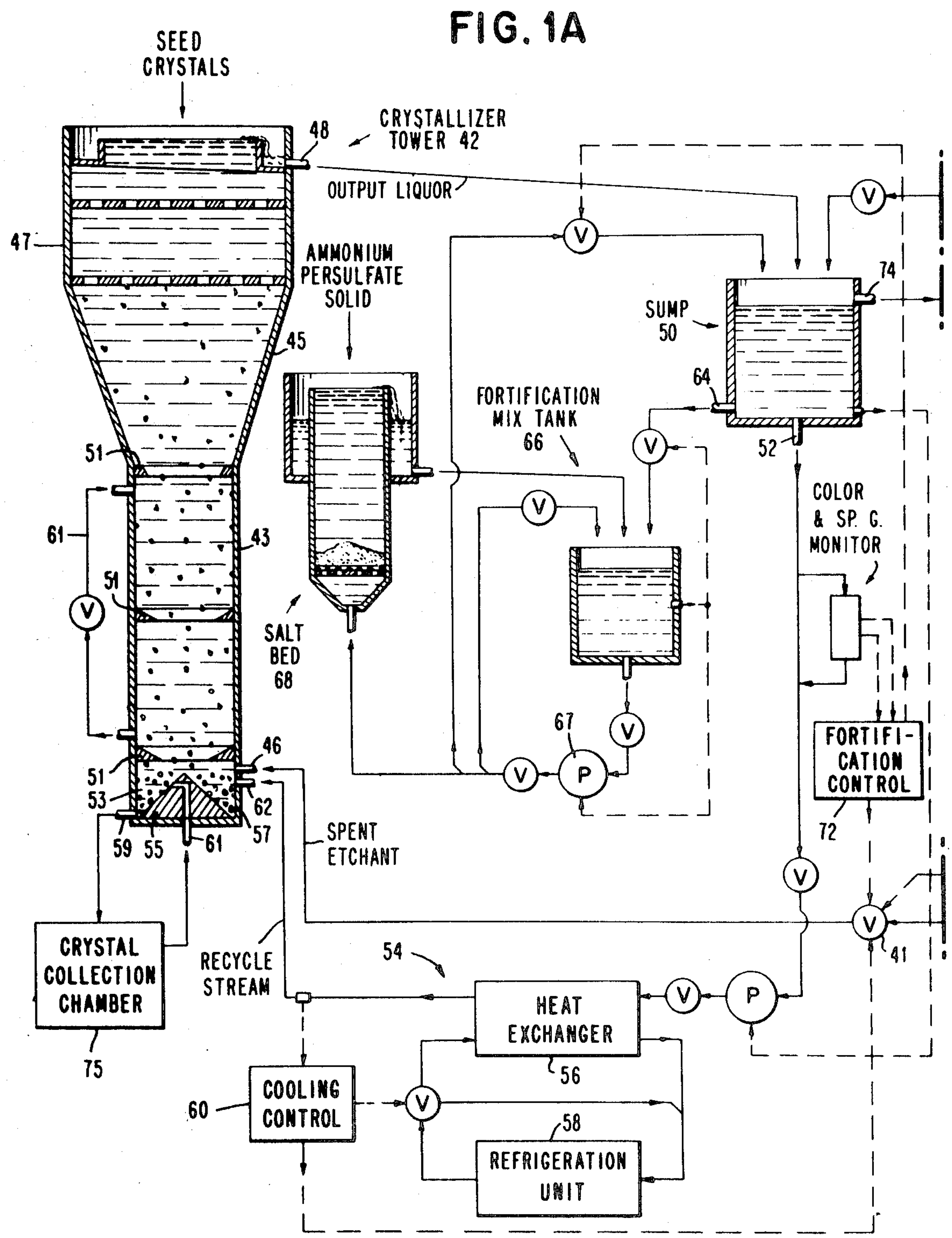
FIGS. 1*a* and 1*b* are a schematic drawing of the overall steady state etching system.
Figure 1:
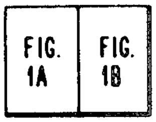
FIG. 1 illustrates the interrelationship between FIGS. 1*a* and 1*b*.
Figure 1B:
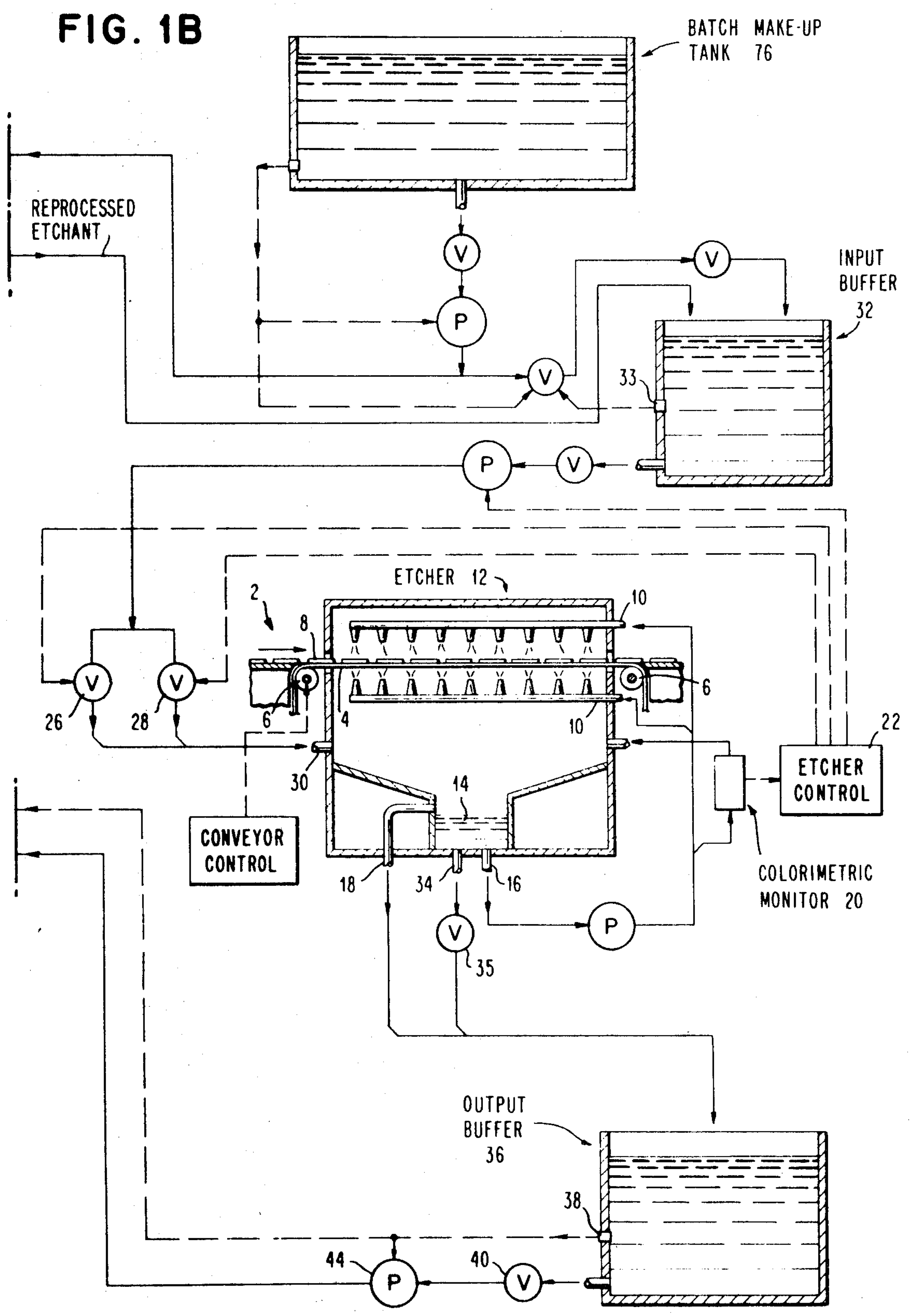

Referring to FIGS. 1*a* and 1*b* there is provided conveyor means, designated generally as 2, comprising a conveyor belt 4 and a plurality of rollers 6, of which only two are shown. The conveyor means 2 transports a plurality of copper cladded printed boards 8 through a double bank of oppositely disposed spray nozzles 10 situated in an etcher 12. As the boards 8 are transported through the double bank of sprayers 10, they are sprayed with an ammonium persulfate etchant 14 which is pumped into the sprayers 10, from the bottom of the etcher 12 through outlet 16. The etchant 14 is maintained at a constant level, and any overflow is exited at overflow outlet 18. As the copper parts 8 are etched, the etchant now containing dissolved copper is permitted to flow to the bottom of the etcher 12 and combine with the etchant 14.

While recirculating the etchant 14 into the spray nozzles 10, for example, by continuous pumping by pump 21, the etchant 14 is also passed through a colorimetric monitor 20, where its copper content is measured. The copper content of the etchant 14 is allowed to reach a preset control point, for example, 3.5 oz./gal. When the copper content is at or below this preset value, the etchant 14 is permitted to flow into the spray nozzles 10. When, however, the copper content of the etchant 14 exceeds the control limit, a signal from the colorimeter monitor 20 is sent to an etcher control 22 which in turn energizes flow control valves 26 and/or 28 into the open position. The valves 26, 28 are operated by a two set point controller, not shown, which operates one or both valves 26, 28 as required to maintain adequate flow.

At this time fresh etchant is allowed to flow through said valves 26 and 28 into the etcher 12 at inlet 30 from an input buffer 32. Simultaneously with the inflow of fresh etchant, the now spent etchant, i.e., etchant having a copper content exceeding the control point concentration, is flowed from the etcher 12 at outlet 34 at the base of the etcher 12, into the output buffer 36. As stated above, the inflow of fresh etchant into the etcher 12 is controlled by the etcher control 22, which simultaneously energizes the valve 35 thus permitting outflow from outlet 34.

The output buffer 36 serves to collect the output of spent etchant from the etcher 12, to eliminate surging in the system and to regulate the subsequent processing of the spent etchant. As the spent etchant enters the output buffer 36 and rises above a limit switch 38, valves 40 and 41 are opened, and the spent etchant is pumped to a crystallization tower 42 by pump 44 through the valves 40 and 41.

The spent etchant from the output buffer 36 tangentially enters the crystallization tower 42 at input 46. The etchant flows upwardly into the tower, during which time copper in the form of the double salt, $CuSO_4:(NH)_4SO_4.6H_2O$, is removed therefrom. The details and operation of the crystallization tower 42 will be explained hereinafter. Partially copper free etchant overflows from the crystallization tower 42 at outlet 48 and flows therefrom into a sump 50 and is recycled through the recyclant loop comprising outlet 52 of sump 50, the heat exchanger 56 and input 62 of the tower 42.

From the sump 50 at outlet 52, the partially copper free etchant is recycled through a heat exchanger unit, shown generally as 54, comprising a heat exchanger 56, a refrigeration unit 58 and a cooling control 60. The heat exchange unit 54 is of the conventional type and need not be explained in detail here. As the recycled partially copper free etchant passes through the heat exchanger 56, it is cooled to a desired operating temperature, e.g., $$55\pm^{1}_{0}\,^{\circ}\text{ F.}$$

at this point the recycled etchant is metastable, i.e., supersaturated. The now supersaturated spent etchant is admitted into the crystallization tower 42 at input 62, where it is mixed with a relatively small quantity of the spent etchant introduced at input 46. The cooled mixture is cycled through the tower 42, and mother liquor (relatively copper free etchant), as stated before, exits at 48 and returns to sump 50.

A portion of the mother liquor from sump 50 is permitted to flow therefrom at outlet 64 into a fortification mix tank 66. From the fortification mix tank 66 the mother liquor is pumped by pump 67 up through a salt bed tank 68 containing solid ammonium persulfate. It is at this point that the ammonium persulfate consumed in the etching process is replaced. As the mother liquor passes through the salt bed tank 68 it becomes nearly saturated with ammonium persulfate. The now saturated mother liquor overflows the salt bed tank 68 and flows back into the fortification mix tank 66 where it is mixed with mother liquor from the crystallizer 42. The mixed solution is ideally maintained at the preset sum molar concentration i.e., the sum of the concentrations of copper and ammonium persulfate, are constant, generally 1.05 molar.

To maintain the refortified mother liquor at the preset sum molar concentration, there is provided conventional monitor means 70 to monitor the color (copper content) and the specific gravity thereof and fortification control means 72. The monitor means 70 is comprised of a colorimeter to determine the color of the mother liquor as a function of copper concentration and a divice for determining the specific gravity of the mother liquor as a function of the ammonium persulfate concentration. Both the colorimeter and specific gravity measuring devices are commercially available. In operation, the colorimeter monitor means 70, properly adjusted, produces a voltage which is linearly proportional to the copper concentration and is represented by the following equation: (1) $E_{cu}=f_1(Cu^{++})$. In addition, the specific gravity measuring device also produces a voltage which is linearly proportional to the specific gravity of the solution, represented by the equation: (2) $E_{sp.\,g.}=f_2(\text{sp. g.})$. With the two devices in the system, the equations 1 and 2 may be combined to give equation: (3)

$$E_{cu}=ME\text{ sp. g.}+E_k$$

where M is a constant and $E_k$ is a preset voltage. By properly operating on the signals (ECu and Esp. g.) it is possible to measure and adjust the ammonium persulfate concentration in the solution. The operation would provide a signal proportional to the direction and magnitude of the error in the solution ($\epsilon$) to drive a proportional control device, indicated as fortification control means 72, to make required corrections. This electrical operation can be expressed as $\epsilon=E_{cu}-f(E_{sp.\,g.})$ or $-E_{cu}\_ME_{sp.\,g.}-E_k$. Depending upon the ammonium persulfate concentration as determined by the above mentioned monitor means 70 and fortification control means 72, a corresponding quantity of the mother liquor concentrated with respect to ammonium persulfate, is made to return to sump 50.

The now refortified mother liquor exits from the sump 50 at outlet 74 and is conducted to the input buffer means 32, from where it is to flow into the etcher 12 as described above. The quantity of refortified solution overflow from sump 50 corresponds to the quantity of spent etchant introduced to the crystallization tower 42 at input 46. The input buffer 32, together with the output buffer 36, serves to accommodate surges from the etcher 12 as they normally occur throughout the operation of the etcher. To assure that the buffer 32 always has etchant solution, an emergency supply of solution is maintained in a batch makeup tank 76. This emergency source of etchant is added to the input buffer 32 only when a low limit switch 33 in the buffer tank 32 is energized, i.e., when the etchant volume falls below the level of the switch 33. Should a gross failure occur in the crystallization tower 42 requiring excessive down time for repair, the emergency source 76 would sustain the etching with manual solution makeup to fill the emergency supply tank 76 as required. Actually, a redundant source of etchant is maintained at all times to assure that etchant will be on hand when the need arises.

According to another aspect of the invention, there is provided an improved continuous crystallization tower for the system, which is the tower 42 illustrated in FIGS. 1*a*, 3, 4 and 5. In crystallization towers of the type shown in the prior art, a supersaturated solution to be crystallized is fed upwardly into the bottom of a vertical conical-shaped tower. The upward flow of the solution is maintained at such a speed that the crystals that are formed are kept in a suspended state in the vessel until they have grown sufficiently to descend down the tower and thus escape through an outlet provided at the base of the vessel.

The prior art crystallizer has several shortcomings, of which the most prominent is the relatively large height to diameter ratios of the tower required to obtain both proper residence time and efficient crystal size distribution. This requirement has made these towers commerically impractical. Further, since cooling was performed entirely within the low turbulence area of the tower, low heat transfer resulted. This demanded a large cooling surface to volume ratio. To provide the heat transfer necessary for efficient crystallization, the tower incorporated a cooling jacket and internal cooling fins, increasing the size and complexity of the equipment. Additionally, in the prior art crystallizer, feed could not be discontinued without disturbing the equilibrium and shutting down the system because crystal suspension was effected entirely by the feed stream.

Figures 3, 5:
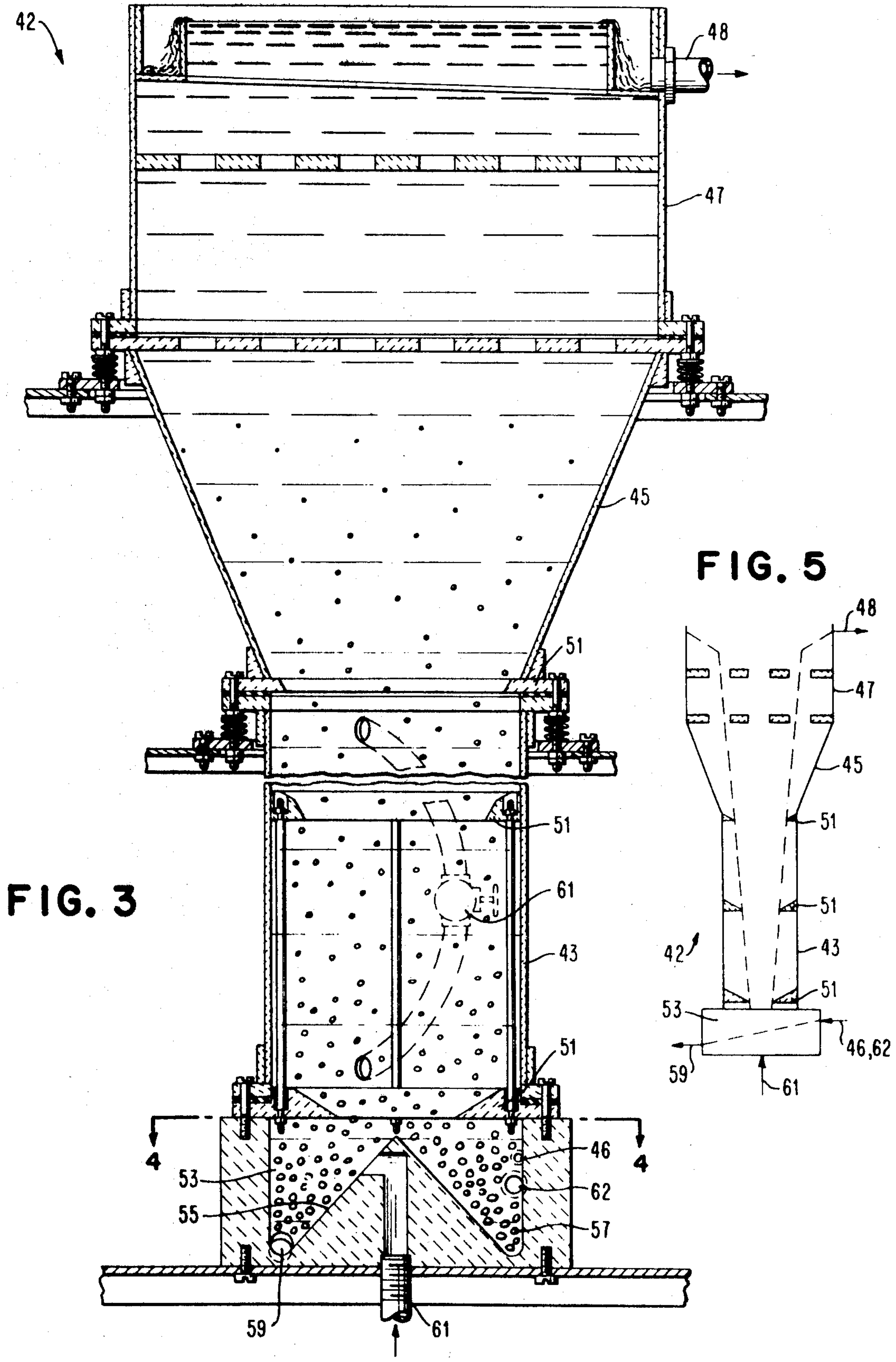
FIG. 3 is a sectional elevation view of an improved continuous crystallization tower.
FIG. 5 is a diagrammatic view of the crystallization tower depicting the upward increase of the inner effective diameter of the crystallization tower.

What is described here is an improved crystallization tower which has overcome the shortcomings of the prior art crystallizes. Referring to FIG. 3, there is shown in considerable detail the crystallization tower of this invention, generally designated as 42 and shown more generally in FIG. 1*a* of the drawings. The tower 42 comprises a first cylindrical portion 43, extending upwardly into a widened, conically-shaped portion 45 and finally to a second cylindrical portion 47. Spaced along the inner wall of the tower 42 are a plurality of adjustable baffles 51. These baffles 51 control crystal size distribution by restricting the cross-sectional area of the tower. This produces an upward liquor velocity necessary to control crystal size above each baffle and yet maintain proper residence time between the baffles so as to reduce the overall height of the tower. The spaced baffles 51 decrease in size upwardly so as to increase the effective inner diameter of the tower 42 upwardly (see FIG. 5) and to distribute larger crystals near the bottom and smaller crystals near the top. Additionally, the baffles 51 serve to create turbulence in the upwardly flowing solution to aid in the crystallization process. The baffles 51 are made interchangeable so that crystals of different sizes may be allowed to precipitate out of the tower 42. At the base of the tower 42, there is positioned a crystal ejection chamber 53 in which there is induced a circular flow of the solution entering the tower 42 at inputs 46 and 62 about a conical guiding member 55, see FIG. 4. This circular flow produces a centrifugal force in the crystals which in turn serves to expel the precipitated crystals 57 through an orifice 59, indicated also in FIG. 4 of the drawings. At the base of the chamber 53 there is a return flow inlet 61, through which mother liquor which carried the precipitated crystals 57 through orifice 59 is returned to the tower 42, after passing through a crystal collection chamber 75, see FIG. 1*a*. The diameter of the tower 42 is large enough in the upper cylindrical section 47 to prevent crystals from overflowing and exiting from the tower 42 at outlet 48.

A manual bypass 61 is also provided to prevent packing of crystals in the lower sections of the tower 42 and to provide additional product crystal size control. By opening the manual bypass 61 for a few seconds, upward flow in the conical sections of the tower 42 is reduced, allowing crystals to drop to the bottom of the tower 42.

The overall height of the tower 42 need not exceed 9 feet, or less than one-third the height of the prior art devices, to produce equivalent amounts of crystallization. A tower of this height and having a volume of 26.7 cubic feet is capable of removing more than 300 oz./hr. of copper. It should be understood that the processing capabilities of the tower 42 is dependent upon its design parameters, and to change such capabilities is within the skill of one skilled in the art.

The tower 42 may be constructed with any suitable metal, i.e., a metal that will not react with the given solution to be crystallized. Alternately, it may be constructed from a plastic material; such as, polyvinyl chloride, polyethylene, polystyrene, and other like material.

In operation, a solution having a crystallizable solute is tangentially fed into the tower 42 at input 46 and is caused to flow circularly about the conical guiding member 55. The velocity at which the solution is injected into the tower 42 is dependent upon the centrifugal force required to eject crystals of a given size and the maximum diameter of the swirl. The swirling solution is caused to flow upward in the tower 42 at constant rate, so as to keep crystals therein suspended. Under constant flow conditions, the particle size of the crystals can be controlled at any point in the tower 42. Varying the diameter of the tower 42 varies the flow per unit area necessary to support the crystals. By gradually increasing the diameter of the tower 42 from bottom to top, a good particle size distribution can be obtained throughout the tower. Small crystals will float near the top; larger crystals will drop toward the bottom.

A portion of the mother liquor which overflows at overflow outlet 48 is recycled into the tower at input 62 through the recyclant loop described above without passing through the etcher 12, illustrated in FIG. 1*b*. Before re-entering the tower 42, the recycled mother liquor is passed through a heat exchanger 56 (see FIG. 1*a*) where it is cooled to a temperature sufficient to induce supersaturation. For example, where the solution contains the double salt $CuSO_4:(NH_4)_2SO_4$, the mother liquor may be cooled to about 55° F. or at a point where the liquor becomes metastable. This cooled recyclant is mixed with the input solution entering the tower 42 at input 44 in a ratio of about 25 parts of recycled to 1 part of the spent etchant initially entering the tower 42. This is to cool the warm etchant coming from the etcher and entering the tower 42 at 46 and to obtain a solution of desired metastability. For example, the recyclant is approximately 9% supersaturated, and the resultant mixture is found to be about 11% supersaturated. At about 11% metastability, crystallization occurs on contact with the crystals resident in the tower 42. Supersaturation is continually decreased as the solution flows upwardly. Therefore, to induce and thereby enhance crystallization near the top of the tower 42, seed crystals of about 60 mesh are dropped into the top of the tower 42 to replace those ejected at the bottom.

As the crystals grow in size, they overcome the force of the upward flow of solution and descend through the tower 42, being held in suspension in each of the conical sections formed by the baffles 51. The crystals remain suspended in each section until they grow to a size sufficient to overcome the upward force in the given section. Thus, as the crystals grow in size, they tend to settle toward the bottom of the tower 42 in the salt ejection chamber 53. Once at the bottom of the tower 42 they are ejected by the centrifugal force caused by the swirling action of the incoming solution, as stated above.

The ejected crystals are collected in the enclosed crystal collection chamber 75 (FIG. 1*a*). The crystal collection chamber 75 contains a fine meshed wire screen, not shown, to prevent crystals from plugging the line through which the carrier mother liquor returns to the tower 42. Return of mother liquor to the tower 42 occurs due to the centrifugal force at the point of ejection, the pressure at point of ejection and in the crystal collection chamber being greater than the pressure at the apex at conical guide member 55.

While the crystallization apparatus has been described in relation to the removal of copper salts from an ammonium persulfate solution, it should be apparent that the apparatus may be used for the removal of the other salts from other solutions.

While the invention has been particularly shown and described with reference to preferred embodiments thereof, it will be understood by those skilled in the art that various changes in form and details may be made therein without departing from the spirit and scope of the invention.

What is claimed is:

1. A steady state etching system comprising:

(a) etching means to etch a series of metal cladded printed circuit boards passing therethrough at a constant rate;

(b) conveyor means to continuously convey metal cladded printed circuit boards at a constant rate through said etching means in which said boards are etched;

(c) conveyor control means to maintain said conveyor means at a constant rate;

(d) conduit means to conduct spent etchant from said etching means;

(e) continuous crystallizing means to continuously remove reaction products from said spent etchant conducted thereto from said etching means through said conduit means;

(f) fortifying means to refortify supernatant mother liquor flowing from said crystallizing means;

(g) fortifying control means connected to said fortifying means to control the refortification of the supernatant mother liquor; and (h) etcher control means to control the input of refortified etchant into said etcher from said fortifying means, whereby a constant volume level of etchant is maintained therein and in which the concentration of said etchant is maintained at a constant value, thereby maintaining a constant etching rate.

2. The steady state etching system of claim 1 wherein there is added sump means to collect the mother liquor output from said crystallizing means and to direct the flow thereof to said fortifying means.

3. The steady state etching system of claim 2 wherein said fortifying means comprises a salt bed tank containing a solid fortifying agent and through which mother liquor from said sump means is caused to flow thereby fortifying the same, and a fortification mix tank wherein mother liquor from the sump means is mixed with refortified mother liquor from said salt bed tank, said mixed mother liquors being returned to said sump means.

4. The steady state etching system of claim 3 wherein there is added monitor means positioned between an outlet of the sump means and the fortifying means to measure the sum concentration of the copper and ammonium persulfate content in the refortified mother liquor and to energize the fortification control means, thus causing said fortification control means to either permit mother liquor to flow to said fortifying means or to bypass the same.

5. The steady state etching system of claim 4 wherein there is added heat exchange means connected between the sump means and the crystallizing means to cool recycled mother liquor to obtain metastability therein, prior to its re-entry into said crystallizing means.

References Cited

UNITED STATES PATENTS

| | | | |
|---|---|---|---|
| 1,023,458 | 4/1912 | Diescher | 134—13UX |
| 2,877,146 | 3/1959 | Francis | 134—13 |

WILLIAM A. POWELL, Primary Examiner

U.S. Cl. X.R.

156—3, 19